(12) United States Patent
Sakata et al.

(10) Patent No.: US 8,659,311 B2
(45) Date of Patent: Feb. 25, 2014

(54) TEST APPARATUS AND TEST METHOD

(75) Inventors: Hiroshi Sakata, Saitama (JP); Ken Miyata, Gunma (JP)

(73) Assignee: Advantest Corporation, Tokyo (JP)

( * ) Notice: Subject to any disclaimer, the term of this patent is extended or adjusted under 35 U.S.C. 154(b) by 311 days.

(21) Appl. No.: 13/205,646

(22) Filed: Aug. 9, 2011

(65) Prior Publication Data

US 2012/0212247 A1 Aug. 23, 2012

Related U.S. Application Data

(63) Continuation of application No. PCT/JP2009/000916, filed on Feb. 27, 2009.

(51) Int. Cl.
*G01R 31/20* (2006.01)

(52) U.S. Cl.
USPC ............ 324/754.11; 324/754.07; 324/754.12; 324/754.13; 324/756.03

(58) Field of Classification Search
None
See application file for complete search history.

(56) References Cited

U.S. PATENT DOCUMENTS

| | | | | |
|---|---|---|---|---|
| 4,348,759 | A * | 9/1982 | Schnurmann | 714/724 |
| 6,107,815 | A * | 8/2000 | Nikutta et al. | 324/762.02 |
| 6,852,052 | B2 * | 2/2005 | Jonas | 474/144 |
| 6,954,079 | B2 * | 10/2005 | Sugimoto et al. | 324/762.01 |
| 7,468,610 | B2 * | 12/2008 | Miyagi et al. | 324/755.04 |
| 7,649,366 | B2 * | 1/2010 | Henson et al. | 324/754.03 |
| 2006/0015785 | A1 * | 1/2006 | Chun | 714/724 |
| 2006/0273809 | A1 * | 12/2006 | Miller et al. | 324/754 |
| 2008/0018350 | A1 * | 1/2008 | Chao et al. | 324/754 |

FOREIGN PATENT DOCUMENTS

| | | |
|---|---|---|
| CN | 1790042 A | 6/2006 |
| JP | H08-129053 A | 5/1996 |
| JP | H9-043309 A | 2/1997 |
| JP | H11-083935 A | 3/1999 |
| JP | 2952331 B | 9/1999 |
| JP | 3238246 B | 12/2001 |
| JP | 2002-76073 A | 3/2002 |
| JP | 2003-297887 A | 10/2003 |
| JP | 2005-10088 A | 1/2005 |
| JP | 3783074 B | 6/2006 |
| JP | 2006-278949 A | 10/2006 |

OTHER PUBLICATIONS

Office action issued on Nov. 27, 2012 by the Japan Patent Office for application No. 2010-036563.
Office action issued on Jan. 10, 2013 by the State Intellectual Property Office of the P.R. China for filing No. 200980157339X.
International Search Report for International Application No. PCT/JP2009/000916 with a mailing date of May 19, 2009.
English Translation of the Written Opinion of the International Search Authority for application PCT/JP2009/000916.

(Continued)

*Primary Examiner* — Richard Isla Rodas

(57) ABSTRACT

Provided is a test apparatus for testing a plurality of devices under test formed on a semiconductor wafer, including: a probe card to be connected to respective contacts of the plurality of the devices under test on a connection surface to be overlapped on the semiconductor wafer, the probe card being provided with a plurality of corresponding contacts on a rear surface of the connection surface; and a test head that tests the plurality of devices under test on the semiconductor wafer by sequentially connecting to each part of the plurality of contacts of the probe card.

5 Claims, 14 Drawing Sheets

(56) References Cited

OTHER PUBLICATIONS

Reasons for Request for Accelerated Examination of Japanese Counterpart Application JP2009-509800 (International Application No. PCT/JP2009/000916), submitted on Feb. 27, 2009.

Reasons for Request for Accelerated Examination of Japanese Counterpart Application JP2009-164856, submitted on Jul. 13, 2009.

Reasons for Request for Accelerated Examination of Japanese Counterpart Application JP2009-165138, submitted on Jul. 13, 2009.

Office action issued by the Korean Intellectual Property Office Notice of Office Action.

* cited by examiner

TEST APPARATUS AND TEST METHOD

BACKGROUND

1. Technical Field

The present invention relates to a test apparatus and a test method.

2. Related Art

Japanese Patent Application Publication No. 2006-278949 describes an examination apparatus for examining a plurality of semiconductor integrated circuits formed on a single wafer collectively. This can improve productivity by shortening the examination time required per wafer.

In accordance with improvement in integration and increase in size of the substrate, the size of the test target when testing each substrate has become enormous. By providing the same number of test circuits and contact terminals as the number of the semiconductor integrated circuits, the size of the test apparatus becomes large. Therefore, test apparatuses have become large and expensive, which impacts the manufacturing cost of the semiconductor apparatuses.

SUMMARY

Therefore, it is an object of an aspect of the innovations herein to provide a test apparatus and a test method, which are capable of overcoming the above drawbacks accompanying the related art. The above and other objects can be achieved by combinations described in the claims. A first aspect of the innovations may include a test apparatus for testing a plurality of devices under test formed on a semiconductor wafer, including: a probe card to be connected to respective contacts of the plurality of the devices under test on a connection surface to be overlapped on the semiconductor wafer, the probe card being provided with a plurality of corresponding contacts on a rear surface of the connection surface; and a test head that tests the plurality of devices under test on the semiconductor wafer by sequentially connecting to each part of the plurality of contacts of the probe card.

A second aspect of the innovations may include a test method for testing a plurality of devices under test formed on a semiconductor wafer, including: preparing a probe card to be connected to respective contacts of the plurality of the devices under test on a connection surface to be overlapped on the semiconductor wafer, the probe card being provided with a plurality of corresponding contacts on a rear surface of the connection surface; and testing the plurality of devices under test on the semiconductor wafer by sequentially connecting to each part of the plurality of contacts of the probe card.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
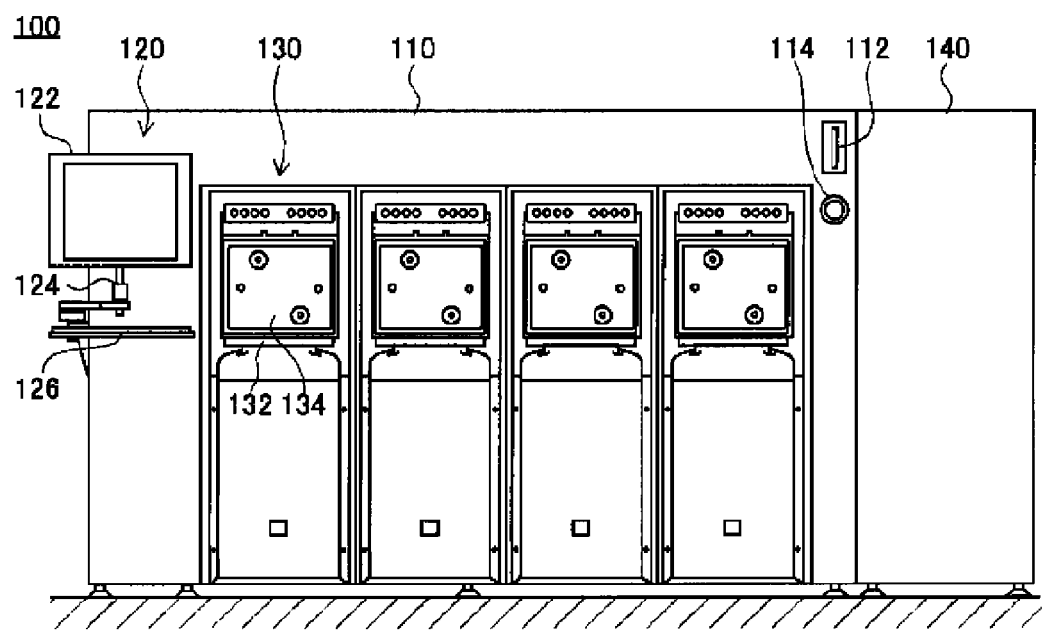
FIG. 1 is a front view of a test apparatus 100.

FIG. 1 is a front view of the entire test apparatus 100. The test apparatus 100 includes an EFEM 110, an operation section 120, a load unit 130, and a chiller 140.

The EFEM 110 has an internal mechanism for transporting, within the test apparatus 100, a substrate to be tested. The EFEM 110 has the largest size in the test apparatus 100, and so a signal lamp 112 representing an operational state of the test apparatus 100 and an EMO 114 that operates for emergency stop of test apparatus 100 are provided high on the front surface of the EFEM 110.

The operation section 120 is also supported by the EFEM 110. The operation section 120 includes a display 122, an arm 124, and an input apparatus 126. An end of the arm 124 is coupled to the EFEM 110, and the other end of the arm 124 supports the display 122 and the input apparatus 126 to be freely movable.

For example, the display 122 includes a liquid crystal display apparatus or the like, and displays the operational state of the test apparatus 100, echo back of the inputted contents from the input apparatus 126. The input apparatus 126 can include a keyboard, a mouse, a track ball, a jog dial or the like, to receive setting, operation, or the like of the test apparatus 100.

The load unit 130 includes a load table 132 and a load gate 134. On the load table 132, a container is mounted which accommodates therein a semiconductor wafer to be tested. The load gate 134 opens and closes for inputting and outputting the semiconductor wafer to and from the test apparatus 100. This enables loading of the semiconductor wafer from outside, without degrading the level of cleanliness within the test apparatus 100.

The chiller 140 supplies a cooled coolant, for example for cooling the wafer before discharge whose temperature has been increased due to the test operation performed by the test apparatus 100. The chiller 140 is therefore equipped with a heat exchanger, and provided in the vicinity of the test head executing a test. Note that the chiller 140 is used for the purpose of cooling the coolant in most cases. However, the chiller 140 can also be used for heating the heat medium for the purpose of supplying a heating thermal source. When the supply source of the heat medium either cooled or heated is provided separately outside the test apparatus 100, the chiller 140 can be omitted from the test apparatus 100.

Figure 2:
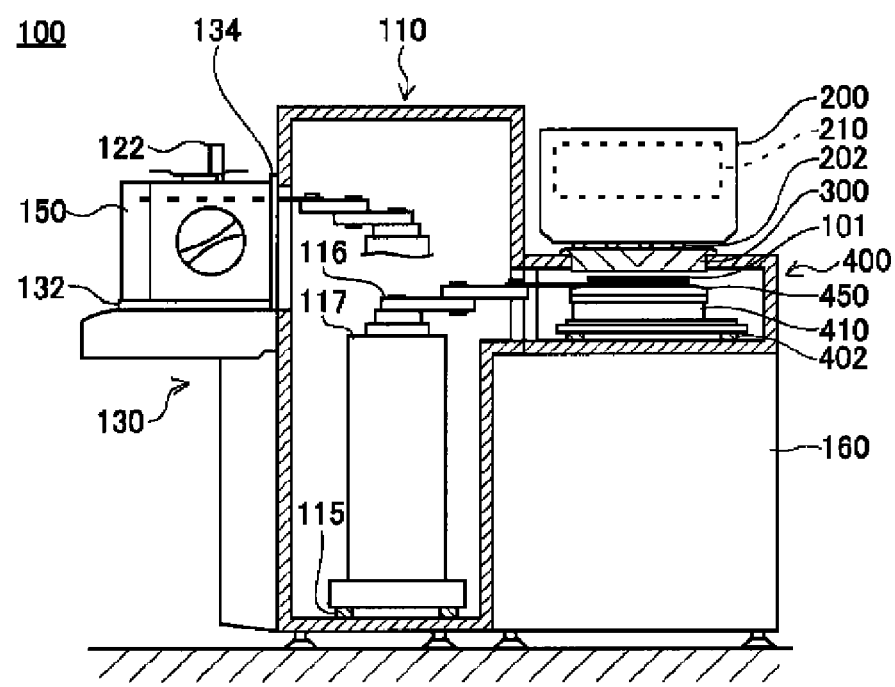
FIG. 2 is a partially longitudinal cross-sectional view of the test apparatus 100.

FIG. 2 is a partially longitudinal cross-sectional view of the test apparatus 100. The elements common to those in FIG. 1 are assigned the same reference numerals, and the overlapping explanation is omitted in the following. The test apparatus 100 includes a load unit 130, an EFEM 110, a main frame 160, an alignment unit 400, a probe card 300, and a test head 200. In this drawing, the chiller 140 is not illustrated.

In this test apparatus 100, the load unit 130, the EFEM 110, and the main frame 160 are provided sequentially adjacent to each other, from the front side (the left side of the drawing) to the rear side (the right side of the drawing). The alignment unit 400, the probe card 300, and the test head 200 are stacked on the main frame 160.

A FOUP 150 is mounted on the load table 132 of the load unit 130. The FOUP 150 stores therein a plurality of wafers 101 to be tested. The FOUP 150 is also used in collecting the wafer 101 having done with a test.

The EFEM 110 includes therein a robot arm 116. The robot arm 116 is mounted on the column 117 running along the rail 115, and transports a wafer between the load unit 130 and the alignment unit 400. For this purpose, the load unit 130 and the EFEM 110, as well as the alignment unit 400 and the EFEM 110 are in airtight communication with each other, to maintain a high level of cleanliness therein.

The main frame 160 controls the operation of the entire test apparatus 100. For example, the main frame 160 is connected to the operation section 120, to receive an input from the input apparatus 126, and reflects it in each section of the test apparatus 100. In addition, the main frame 160 generates display contents in which the operational state of the test apparatus 100 is reflected, and displays it on the display 122.

Furthermore, the main frame 160 synchronizes the operations of the load unit 130, the EFEM 110, and the alignment unit 400, to enable exchange of the wafer 101 thereamong. Still further, when the EMO 114 is operated, the main frame 160 immediately halts the operation of each section of the test apparatus 100. These operations are required regardless of the type of the wafer 101 to be tested or the contents of the test. Therefore, the main frame 160 is permanently included in the test apparatus 100.

The alignment unit 400 includes an alignment stage 410. In other words, by exchanging the probe card 300, the test apparatus 100 can cope with wafers 101 having different layouts.

The alignment stage 410 mounts thereon a wafer tray 450 and a wafer 101, to run along the rail 402. In addition, the alignment stage 410 is extendable in the vertical direction, to be able to raise or lower the wafer 101 mounted thereon. This allows alignment of the wafer 101 with respect to the probe card 300, and pressing of the wafer 101 onto the probe card 300 thereabove.

When executing a test in the test apparatus 100, the probe card 300 electrically connects the test head 200 to the wafer 101, by being positioned between the test head 200 and the wafer 101. Accordingly, an electric signal path is formed between the test head 200 and the wafer 101.

The test head 200 stores therein a plurality of pin electronics 210. An electric circuit required for the target and contents of each test is mounted to the pin electronics 210. In other words, the test head 200 is electrically connected to the probe card 300, via the contactor 202 mounted on its lower surface.

In the above-explained test apparatus 100, the wafer 101 to be tested is mounted to the load table 132, in the state accommodated in the FOUP 150. The robot arm 116 takes out the wafers 101 one at a time using the load gate 134, to transport them to the alignment unit 400.

In the alignment unit 400, the wafer 101 is mounted on the wafer tray 450 on the alignment stage 410. The alignment stage 410 aligns the mounted wafer 101 with respect to the probe card 300, and presses the wafer 101 from below the probe card 300. The subsequent operations are detailed later.

Figure 3:
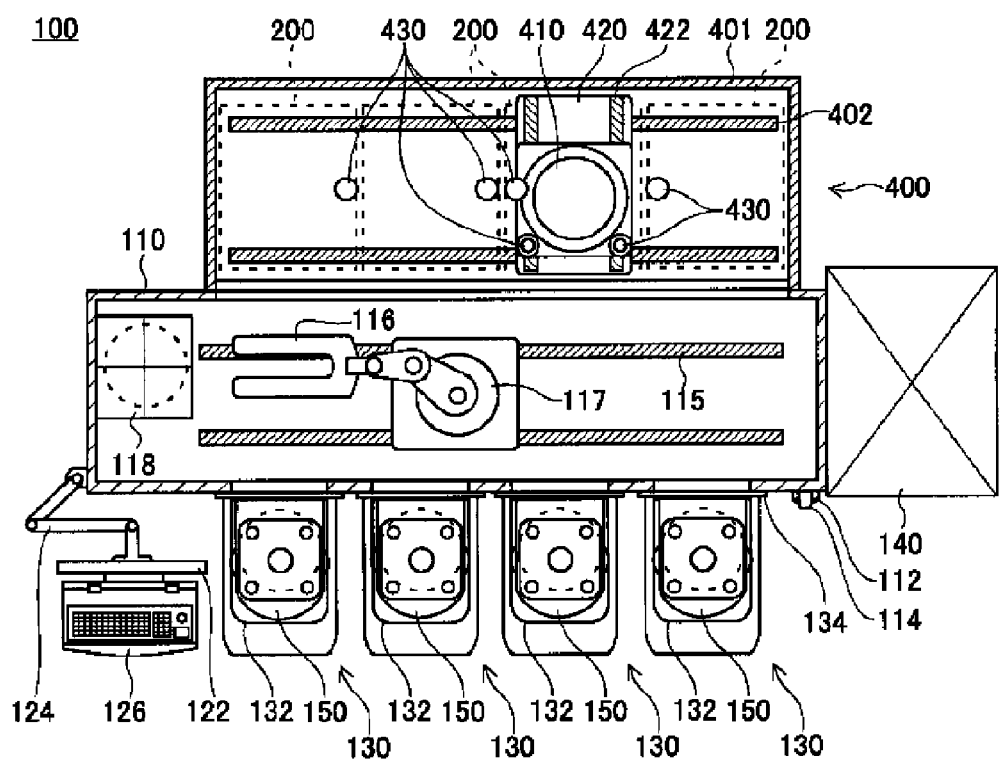
FIG. 3 is a partial horizontal cross-sectional view of the test apparatus 100.

FIG. 3 is a partial horizontal cross-sectional view of the test apparatus 100. The elements common to those in FIG. 1 and FIG. 2 are assigned the same numerals, and their explanation is omitted in the following. The test apparatus 100 includes four load units 130 and four test heads 200. Moreover, a FOUP 150 is loaded to each of the load units 130.

One EFEM 110 and one alignment unit 400 are provided. In addition, the alignment unit 400 includes a single alignment stage 410.

In the EFEM 110, a column 117 supporting the robot arm 116 moves in substantially the entire width of the EFEM 110 along the rail 115. Accordingly, the robot arm 116 can transport the wafer 101 to all the four load units 130 and the four test heads.

Note that a pre-aligner 118 is provided at one end inside the EFEM 110 which is opposite to the chiller 140. The pre-aligner 118 adjusts the position of the wafer 101 with respect to the robot arm 116, with considerably high level of accuracy though lower than required by the test head 200.

Accordingly, the initial positioning accuracy with which the robot arm 116 mounts the wafer 101 on the wafer tray 450 improves, to shorten the time required for alignment with respect to the probe card 300. Moreover, the throughput of the test apparatus 100 can be improved.

The alignment unit 400 includes rails 402, 422, a stage carrier 420, an alignment stage 410, and a microscope 430. The rail 402 is provided along the entire width of the lower surface of a casing 401. The stage carrier 420 moves along the rail 402 in the lengthwise direction of the casing 401.

On the upper surface of the stage carrier 420, a rail 422 runs orthogonal to the rail 402 of the casing 401. The alignment stage 410 moves along the rail 422 in the widthwise direction of the casing 401.

Some microscopes 430, associated with test heads 200 respectively, are provided in close proximity of the probe cards 300 respectively. These microscopes 430 are provided downward from the ceiling wall of the casing 401.

In addition, a pair of microscopes 430 are mounted to the stage carrier 420 together with the alignment stage 410. The pair of microscopes 430 move together with the alignment stage 410. In addition, these microscopes 430 are provided upward.

Using the microscopes 430, the wafer 101 on the alignment stage 410 can be aligned with respect to the probe card 300. That is, right after mounted on the alignment stage 410, the wafer 101 is aligned with the accuracy of pre-alignment. By detecting the edge or the like of the wafer 101 by means of the microscopes 430 oriented downward, the accurate position of the wafer 101 can be detected.

On the other hand, the relative position of the microscope provided in the casing 401 with respect to the probe card 300 is known. Accordingly, it becomes possible to detect the difference between the position of the wafer 101 and the position of the probe card 300, to be able to align the wafer 101 and the probe card 300 by moving the alignment stage 410 to compensate for the detected difference.

Note that the detection of the wafer 101 is not limited to detection of the edge, and it is also possible to display the image of the microscope 430 on the display 122, to enable manual alignment. In addition, by referring to the fiducial mark provided on the wafer tray 450 or the like, the test apparatus 100 may perform automatic alignment.

Figure 4:
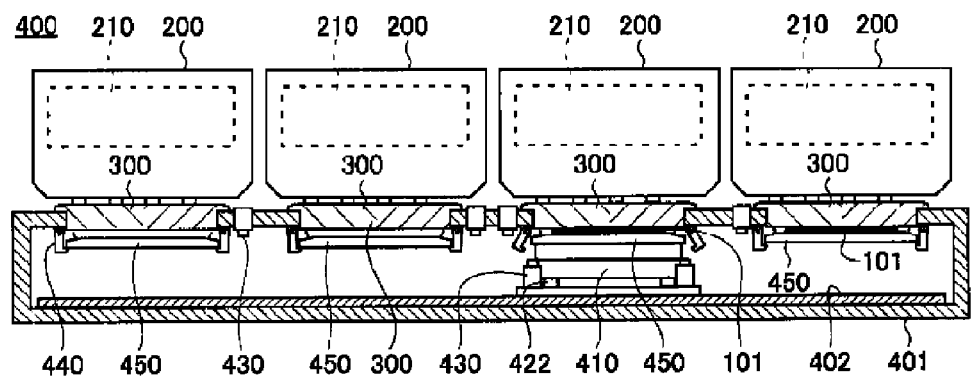
FIG. 4 is a partial longitudinal cross-sectional view of an alignment unit 400.

FIG. 4 is a partial longitudinal cross-sectional view showing the structure of an alignment unit 400. The elements common to FIG. 1 to FIG. 3 are assigned the same reference numerals, and the overlapping explanation is omitted in the following. The alignment unit 400 includes a casing 401, an alignment stage 410, and a hanger hook 440.

The casing 401 has a width corresponding to the plurality of test heads 200 (e.g., four test heads 200). In addition, on the upper surface of the casing 401, four probe cards 300 are mounted for the test heads 200, respectively. Furthermore, on the ceiling wall inside the casing 401, hanger hooks 440, operable to open and close, are provided in position corresponding to the test heads 200, respectively.

When closed, the hanger hook 440 suspends a wafer tray 450, to maintain it immediate below the probe card 300. When opened, the hanger hook 440 releases the wafer tray 450. Accordingly, the alignment unit 400 will have the wafer tray 450 ready and waiting, immediately below each of the test head 200 and the probe card 300.

The alignment stage 410 can move under any test head 200 along the rail 402 provided on the bottom surface of the casing 401. In addition, the alignment stage 410 is extendable in the vertical direction, to raise or lower the mounted wafer tray 450 or the like.

In the alignment unit 400 having the above-detailed structure, the wafer tray 450 held by the hanger hook 440 is temporarily mounted on the alignment stage 410 alone, due to rise of the alignment stage 410 from below. Subsequently, by lowering the alignment stage 410 after opening the hanger hook 440, the wafer tray 450 is released from the hanger hook 440.

Furthermore, the robot arm 116 of the EFEM 110 mounts the wafer 101 onto the wafer tray 450 whose upper surface is released by the lowering of the alignment stage 410. In this way, the alignment stage 410 can mount thereon the wafer 101 in the state mounted on the wafer tray 450.

Next, while aligning the wafer 101 with respect to the probe card 300, the alignment stage 410 raises the wafer tray 450 to press it against the lower surface of the probe card 300. The probe card 300 adsorbs the pressed wafer tray 450 and the wafer 101. The structure of the probe card 300 to adsorb the wafer 101 and the wafer tray 450 is detailed later.

The alignment stage 410 leaves behind the wafer 101 and the wafer tray 450, to transport another wafer 101. In this way, the wafer 101 can be loaded to the test head 200.

For collecting the wafer 101 after the test, the above-explained series of operations can be executed in the reverse order. In this way, the robot arm 116 can output the wafer 101 to outside, and the wafer tray 450 can wait immediately below the test head 200.

In the illustrated example, the wafer tray 450 and the wafer 101 are adsorbed on the probe card 300, at position immediately below the test head 200 on the right in the drawing. Although closed, the hanger hook 440 is not in contact with the wafer tray 450.

Immediately below the second test head 200 from the right, the alignment stage 410 presses upward the wafer tray 450 and the wafer 101, to be in close contact with the lower surface of the probe card 300. Under the other test head 200, the hanger hook 440 is waiting holding the wafer tray 450.

In this way, each of the four test heads 200 is equipped with a wafer tray 450, in the alignment unit 400. Accordingly, each of the test heads 200 can test a wafer 101 independently from one another.

Note that a plurality of test heads 200 can either execute the same type of test as each other, or execute different types of tests from each other. In the latter case, by causing the plurality of test heads to perform a test that takes a long time, the throughput of the test apparatus 100 can improve.

In this way, in the test apparatus 100, a single alignment stage 410 and a single robot arm 116 are used for the plurality of test heads 200. As a result, the usage efficiency of the alignment stages 410 and the robot arms 116 that are not necessary during a test can improve.

Figure 5:
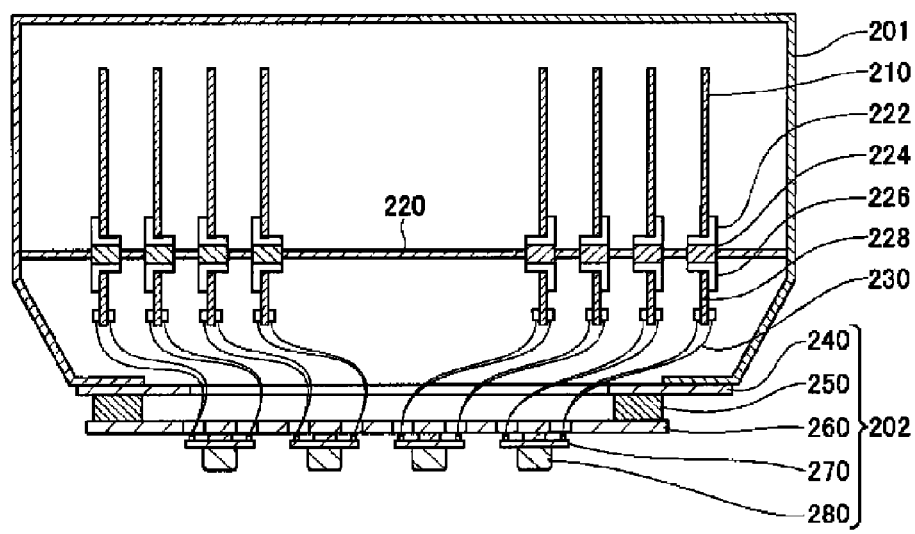
FIG. 5 is a cross sectional view of a test head 200.

FIG. 5 is a cross sectional view of a test head 200. The elements common to FIG. 1 to FIG. 4 are assigned the same reference numerals, and the overlapping explanation is omitted in the following. The test head 200 includes a casing 201, a contactor 202, pin electronics 210, a motherboard 220, and flat cables 230.

Inside the casing 201, the motherboard 220, having a plurality of relay connectors 224, is provided horizontally, The relay connectors 224 respectively have a receptacle on the upper surface side and the lower surface side of the motherboard 220, and form a signal path penetrating the motherboard 220.

On the upper surface of the motherboard 220, the pin electronics 210 are loaded to the relay connectors 224, respectively, via the angle connectors 222. According to such a configuration, the pin electronics 210 can be exchanged according to the specification of the test target and the test contents.

The plurality of pin electronics 210 may have either the same specification as each other, or different specifications from each other. Moreover, some relay connectors 224 may not be provided with any pin electronics 210.

Under the motherboard 220, each of the relay connectors 224 is connected to a small substrate 228 via the angle connector 226. An end of a flat cable 230 is connected to a small substrate 228. Accordingly, each pin electronics 210 inside the casing 201 can be connected to a later detailed contactor 202, via a flat cable 230.

The contactor 202 is attached on the lower surface of the casing 201. The contactor 202 includes a supporting substrate 240, a third-dimensional actuator 250, a contactor substrate 260, a sub-substrate 270, and a contactor housing 280.

The supporting substrate 240 is fixed to the casing 201 on its upper surface, as well as supporting an upper end of the third-dimensional actuator 250 on its lower surface. The lower end of the third-dimensional actuator 250 supports the contactor substrate 260. The sub-substrate 270 and the contactor housing 280 are further fixed to the lower surface of the contactor substrate 260.

The third-dimensional actuator 250 is movable in the horizontal direction along the lower surface of the supporting substrate 240, as well as extendable in the vertical direction. Accordingly, the contactor substrate 260 can be moved three-dimensionally. When the contactor substrate 260 has moved, the sub-substrate 270 and the contactor housing 280 also move together with the contactor substrate 260.

The lower end of the flat cable 230 is coupled to a terminal (e.g., spring pin) held by the contactor housing 280. Accordingly, the pin electronics 210 are electrically connected up to the lowest surface of the test head 200.

Figures 6, 7:
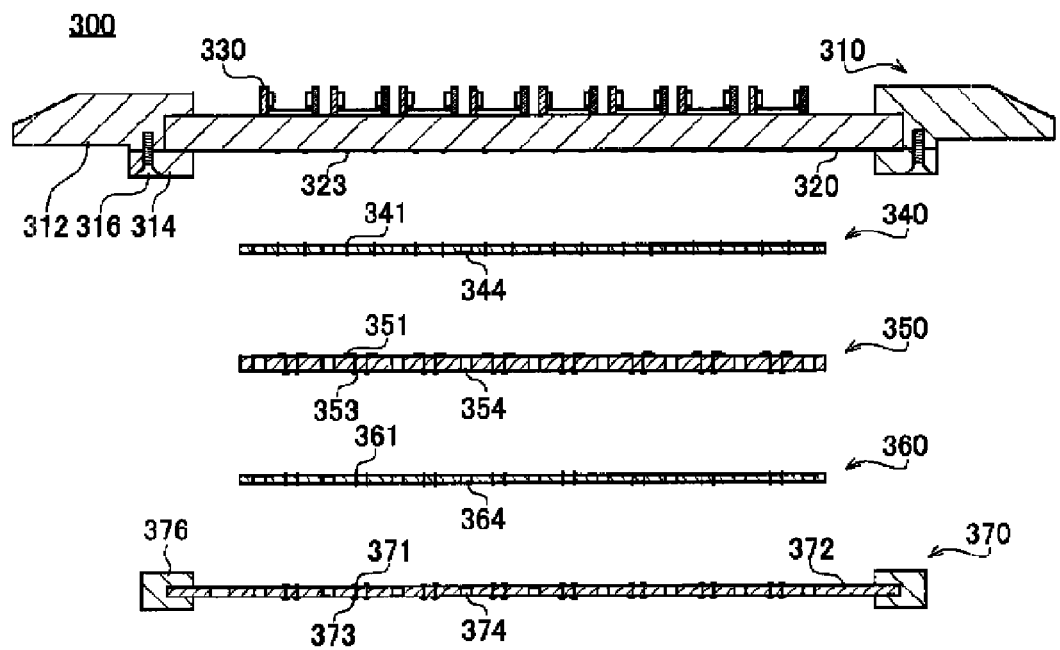
FIG. 6 is an exploded view of a probe card 300.
FIG. 7 is a partial enlarged cross-sectional view of a membrane unit 370.

FIG. 6 is an exploded view of a probe card 300. The probe card 300 includes an interconnection substrate 320, PCR sheets 340, 360, an interposer 350, and a membrane unit 370.

The interconnection substrate 320 is made of an insulating substrate having comparatively high mechanical strength (e.g., polyimide plate). The periphery portion of the interconnection substrate 320 is sandwiched between an upper frame 312 and a lower frame 314 each in a frame shape and stacked on each other to be fastened by mean of screw 316 for example. Accordingly, the mechanical strength of the interconnection substrate 320 further improves.

In addition, the interconnection substrate 320 includes a plurality of guide units 330 on its upper surface. When the contactor 202 abuts against the interconnection substrate 320, the guide units 330 guide the contactor 202 to be aligned.

Furthermore, a plurality of contacting pads 323 are provided on the lower surface of the interconnection substrate 320, which obtain electrical connection by contact. The contact pads 323 are electrically connected to the contact pads (not shown in the drawing) provided inside the guide units 330, on the upper surface of the interconnection substrate 320.

The PCR sheet 340 includes through vias 341 penetrating it from the front surface to the rear surface. The through vias 341 of the PCR sheet 340 are provided in the same layout as the contact pads 323 of the lower surface of the interconnection substrate 320. Accordingly, when the interconnection substrate 320 is layered on the PCR sheet 340 in close contact with each other, the contact pads 323 and the through vias 341 will be in electrical connection with each other.

The interposer 350 has contact pads 351, 353, respectively on the upper surface and the lower surface. The contact pads 351 on the upper surface are provided in the same layout as the through vias 341 of the PCR sheet 340. Accordingly, when the PCR sheet 340 is layered on the interposer 350 in close contact with each other, the through vias 341 and the contact pads 351 will be in electrical connection with each other.

The contact pads 353 on the lower surface of the interposer 350 are provided in a different layout than that of the contact pads 351 on the upper surface. Therefore, the pitch of the contact pads 351 is different from the pitch of the contact pads 353 on the front surface and the rear surface of the interposer 350. However, there will be a contact pad 351 on the upper surface corresponding to a contact pad 353 on the lower surface, so that the contact pad 351 and the contact pad 353 corresponding to each other are electrically connected with each other.

The PCR sheet 360 includes through vias 361 penetrating it from the front surface to the rear surface. The through vias 361 of the PCR sheet 360 are provided in the same layout as the contact pads 353 on the lower surface of the interposer 350. Accordingly, when the interposer 350 is layered on the PCR sheet 360 in close contact with each other, the contact pads 353 and the through vias 361 will be in electrical connection with each other.

The membrane unit 370 has an elastic sheet 372, contact pads 371, bumps 373, and a frame 376. The elastic sheet 372 is formed by an insulating material having elasticity.

The contact pads 371 are provided on the upper surface of the elastic sheet 372 in the same layout as the through vias 361 on the lower surface of the PCR sheet 360. Accordingly, when the PCR sheet 340 is layered on the membrane unit 370 in close contact with each other, the through vias 361 and the contact pads 371 will be in electrical connection with each other.

The bumps 373 are provided on the lower surface of the elastic sheet 372. The frame 376 grasps the periphery portion of the elastic sheet 372, to maintain the elastic sheet 372 to be flat.

Note that the PCR sheets 340, 360, the interposer 350, and the membrane unit 370 include the through holes 344, 354, 364, and 374, respectively. The through holes 344, 354, 364, and 374 are laid out in substantially the same position as each other. By doing so, when the PCR sheets 340, 360, the interposer 350, and the membrane unit 370 are layered, the through holes 344, 354, 364, and 374 will be in communication, to help evacuate between members.

FIG. 7 is a partial enlarged cross-sectional view of a membrane unit 370. In the membrane unit 370, the bumps 373 are provided in the same layout as the device pads provided for testing in the circuit on the wafer 101 to be tested.

In addition, the bumps 373 form a set that includes a plurality of bumps 373, corresponding to each circuit on the wafer 101, and there are formed the same number of sets as the number of the circuits on the wafer 101. Each of the bumps 373 is shaped such that its center protrudes downward. By doing so, the bump 373 can function as a probe terminal with respect to the wafer 101, on the lowest surface of the probe card 300.

Each of the bumps 373 is electrically connected to any of the contact pad 371 via the through hole 375 embedded in the elastic sheet 372. As already explained, the contact pads 371 are provided in the same layout as the through vias 361 of the PCR sheet 360, and as the contact pads 353 on the lower surface of the interposer 350. Therefore, when the membrane eunit 370, the PCR sheet 360, and the interposer 350 are layered on each other, the members from the bumps 373 to the interposer 350 will be electrically connected to each other.

Figure 8:
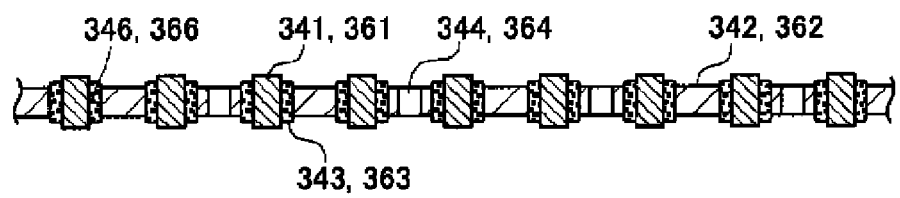
FIG. 8 is a partial enlarged cross-sectional view of PCR sheets 340, 360.

FIG. 8 is a partial enlarged cross-sectional view of PCR sheets 340, 360. The PCR sheets 340, 360 include the through vias 341, 361, the frames 342, 362, and the elastic supports 343, 363.

The frames 342, 362 are made by a material having a comparatively high rigidity (e.g., metal), and have a plurality of through holes 346, 366 whose inner diameter is larger than the outer diameter of the through vias 341, 361. Each of the through vias 341, 361 is supported by the frame 362 inside the through holes 346, 366, through the elastic supports 343, 363.

The elastic supports 343, 363 are made by a flexible material such as silicone rubber. The through vias 341, 361 have a length larger than the thickness of the frame 362. As a result, when the PCR sheets 340, 360 are sandwiched either between the interposer 350 and the interconnection substrate 320, or between the interposer 350 and the membrane unit 370, the variation of concave/convex of each member is absorbed, to establish favorable electrical connection.

Figure 9:
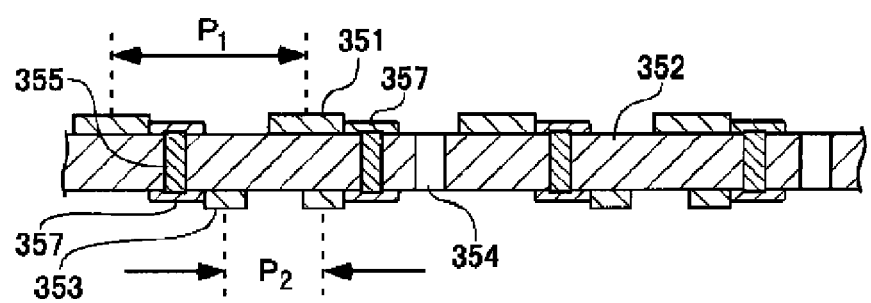
FIG. 9 is a partial cross-sectional view of an interposer 350.

FIG. 9 is a partial cross-sectional view of an interposer 350. The substrate 352 of the interposer 350 includes a plurality of through holes 355 penetrating the substrate 352 from the front surface to the rear surface. Each of the through holes 355 is connected to contact pads 351, 353, via the interconnection layer 357. Accordingly, the contact pads 351, 353 respectively on the front surface and the rear surface of the substrate 352 are electrically connected to each other.

Since there are the interconnection layers 357 interposed between the through holes 355 and the contact pads 351, 353, the contact pads 351 on the upper surface can be arranged in a pattern different from that of the contact pads 353 on the rear surface. Accordingly to this configuration, even if the contact pads 353 on the lower surface of the interposer 350 are matched to the device pads of the wafer 101 to be tested, the contact pads 351 on the upper surface of the interposer 350 can be laid out arbitrarily.

To be more specific, since the device pads of the wafer 101 have already been built in the integrated circuit, the respective areas thereof as well as the pitch between the device pads are small. However, while matching the pitch P2 of the contact pads 353 on the lower surface of the interposer 350 to the pitch of the device pads, the pitch P1 of the contact pads 351 on the upper surface of the interposer 350 is widened, to be able to widen the pitch for the through vias 341 and for the contact pads 323 on the PCR sheet 340 and the interconnection substrate 320 layered above the interposer 350.

In this way, the pitch for the contact pads 321 provided on the upper surface of the probe card 300 can be made wider than that of the bumps 373 of the spring-pin membrane unit 370 of the contactor 202. In addition, the area of the contact pads 321 can be made wider than that of the bumps 373. This may facilitate the connection between the contactor 202 and the probe card 300.

In addition, by setting the area of the contact pads 351 on the upper surface of the interposer 350 to be larger than the area of the contact pads 353 on the lower surface, the positional accuracy requirement common to the interposer 350, the PCR sheet 340, and the interconnection substrate 320 can be alleviated, as well as enhancing the electric characteristics attributed to the contact resistance or the like.

Figure 10:
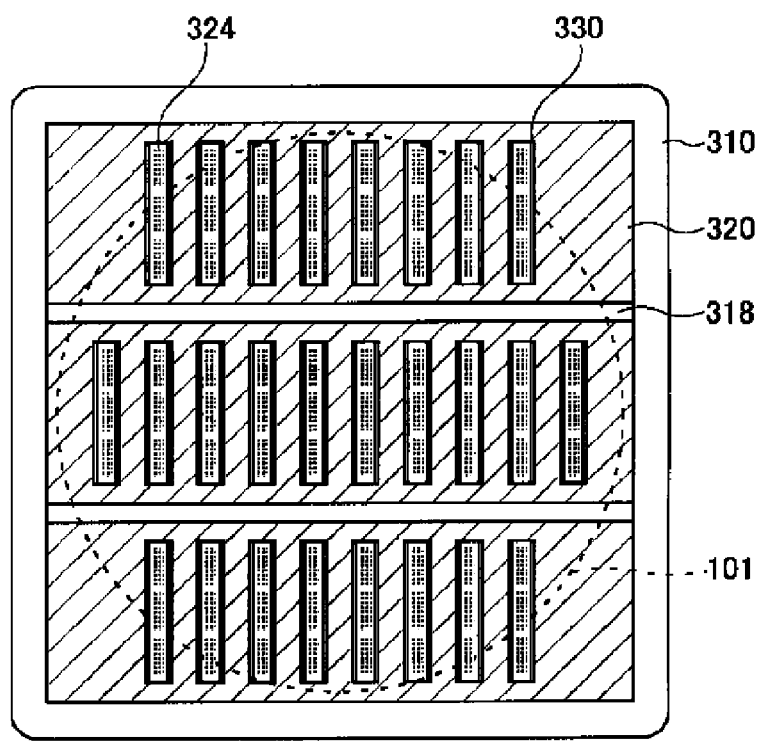
FIG. 10 is a plan view of an interconnection substrate 320.

FIG. 10 is a plan view of an interconnection substrate 320. The interconnection substrate 320 has a plan shape of a rectangle slightly larger than the rectangle circumscribing the wafer 101 shown by a dotted line. The stiffener 310 encloses the exterior of the interconnection substrate 320. The stiffener 310 includes a cross member 318 crossing the interconnection substrate 320.

The cross member 318 is attached to the stiffener 310 in the frame shape with high rigidity. Accordingly, the flexural rigidity of the interconnection substrate 320 as a whole improves by being integrated with the stiffener 310, as well as enhancing its torsional rigidity. As a result, the deformation of the interconnection substrate 320 (e.g., warpage) can be retrained. Note that the entire stiffener 310 including the cross member 318 can be shaped integrally from the beginning.

A plurality of guide units 330 are provided on the upper surface of the interconnection substrate 320 to be parallel with each other between the stiffener 310 and the cross member 318. In addition, inside each of the guide units 330, a plurality of contact pads form a pad group 324 on the upper surface of the interconnection substrate 320. In this way, the plurality of contact pads 321 of the probe card 300 may be formed by "n" sets of pad groups 324 having the same signal arrangement as each other.

The pad groups 324 have the same arrangement as each other. Each of the contact pads constituting the pad group 324 is electrically connected to any of the contact pads 321 provided on the lower surface of the interconnection substrate 320. However, the pad groups 324 share a common signal arrangement for each contact pad.

In this way, the pad group 324 to be tested in a single connection by the contactor 202 may have an arrangement corresponding to the device pad having the same signal arrangement as each other on the wafer 101. As a result, the contactor 202 having the same specification can be used to form an electrical connection in the group pad 324. In addition, it is also possible to form an electrical connection to the plurality of pad groups 324 by moving a single contactor 202.

The interconnection substrate 320 has a contact pad also in the region overlapping with the wafer 101, to have an occupation area similar to that of the wafer 101. This contributes to reduction of the size of the probe card 300 including the interconnection substrate 320, as well as to reduction in space of the test apparatus 100.

Figure 11:
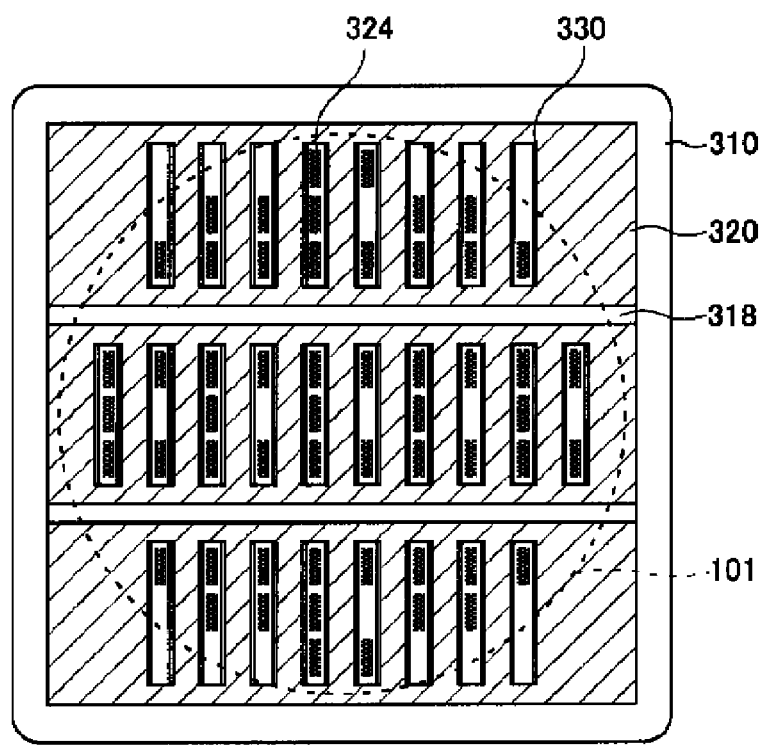
FIG. 11 is a plan view of the interconnection substrate 320.

FIG. 11 is a plan view of the interconnection substrate 320 having pad groups 324 laid out differently. Except for the following explanation, this interconnection substrate 320 shown in FIG. 11 has the same configuration as that of the interconnection substrate 320 shown in FIG. 10. The common elements are assigned the same reference numerals, and the overlapping explanation is not done in the following.

The interconnection substrate 320 is provided with a plurality of guide units 330, and a pad group 324 is provided within in each of the guide units 330. Note that on this interconnection substrate 320, the number of provided pad groups 324 is different for each guide unit 330.

That is, when the number of device pads on the wafer 101 to be tested by the test apparatus 100 is small, the number of contact pads 321 of the probe card 300 can be reduced. Accordingly, the cost incurred in a test can be reduced by reducing the cost of the probe card 300. This also helps alleviate the load of the test apparatus 100.

Figure 12:
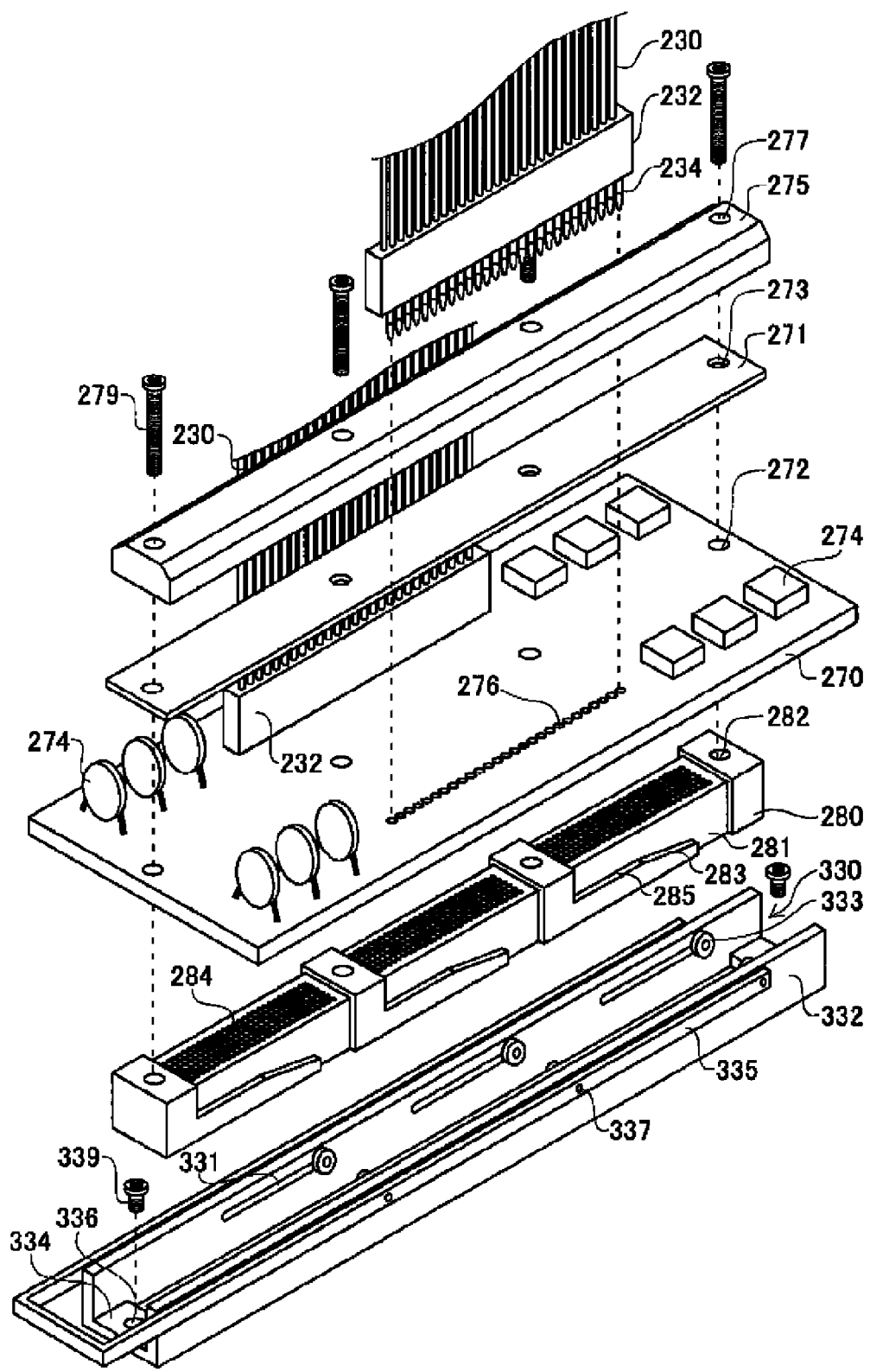
FIG. 12 is a partial exploded slanting view of a contactor 202.

FIG. 12 is a partial exploded slanting view of a contactor 202. The contactor 202 includes a sub-substrate 270 and a contactor housing 280. The sub-substrate 270 has a length substantially equal to the size of the contactor housing 280 in the lengthwise direction, and a width larger than the width of the contactor housing 280.

The sub-substrate 270 also includes screw holes 272 penetrating in its thickness direction and a receptacle 276. The screw holes 272 have the same arrangement as that of the screw holes 282 of the contactor housing 280 detailed later, and respectively have an inner diameter allowing insertion of a screw 279.

The receptacle 276 has a shape complementary to the shape of the contact pin 234 protruding downward from a connector housing 232. The connector housing 232 is mounted at the lower end of the flat cable 230, where each of the contact pins 234 is electrically connected to each wire of the flat cable 230.

The receptacle 276 is connected to a not illustrated interconnection of the sub-substrate 270. Accordingly, when the contact pin 234 is inserted to the receptacle 276, the flat cable 230 and the interconnection of the sub-substrate 270 will be electrically connected to each other.

The upper surface of the sub-substrate 270 is provided with an insulating sheet 271, a reinforcing member 275, and a mounting component 274. The insulation sheet 271 and the reinforcing member 275 respectively have substantially the same occupation area as that of the contactor housing 280. In addition, the insulating sheet 271 and the reinforcing member 275 have the same arrangement as that of the screen holes 272 of the sub-substrate 270, and have screw holes 273, 277 penetrating it in its thickness direction.

The insulating sheet 271 is made by a dielectric material, and inserted between sub-substrate 270 and the reinforcing ember 275. By doing so, even when a circuitry is formed on the upper surface of the sub-substrate 270, a material having conductivity such as metal can be used as the reinforcing member 275.

The mounting component 274 can be an electric element such as a bypass capacitor. By mounting this type of element onto the sub-substrate 270, noise can be restrained in the immediate vicinity of the wafer 101.

Note that the size of the sub-substrate 270 can be changed as necessary. That is, when a multitude of mounting components 274 are mounted on the sub-substrate 270, the size of the sub-substrate 270 can be increased in the range not to interfere with the sub-substrate 270 of the adjacent contactor housing 280. On the other hand, when another configuration is taken, e.g., in which the flat cable 230 is directly coupled to the contactor housing 280, the sub-substrate 270 can be omitted.

The contactor housing 280 includes a multitude of housing holes 284 which open upward, and level differences each including a tilting portion 283 and a horizontal portion 285. The housing holes 284 penetrate the contactor housing 280 in its height direction. The horizontal portion 285 and the tilting portion 283 are provided in about the middle in the height of the contactor housing 280, and a part of it in the lengthwise direction forms a passing portion 281 not having any level difference.

The reinforcing member 275 and the insulating sheet 271 are fastened to the contactor housing 280 by the screw 279, with the sub-substrate 270 sandwiched therebetween. Accordingly, the sub-substrate 270, the insulating sheet 271, and the reinforcing member 275 are integrated with each other, to realize high mechanical strength.

The guide unit 330 includes a channel member 332, a roller 333, an operation bar 335, and a spindle 337. The channel member 332 has a shape in which the both ends of a pair of vertical walls are coupled together by a pair of horizontal links 334 A screw hole 336 is provided through the center of the link 334.

An elongate hole 331 penetrates the vertical wall of the channel member 332 and elongates in the lengthwise direction of the channel member 332. The roller 333 is supported by an end of the spindle 337 inserted in the elongate hole 331, and is positioned inside the channel member 332. The other end of the spindle 337 is linked by the operational bar 335.

As a result, when the operational bar 335 has moved in the lengthwise direction of the channel member 332, the plurality of rollers 333 also move collectively. Note that the guide units 330 are fixed to the upper surface of the interconnection substrate 320 by means of the screws 339 inserted in the screw holes 336.

Figure 13:
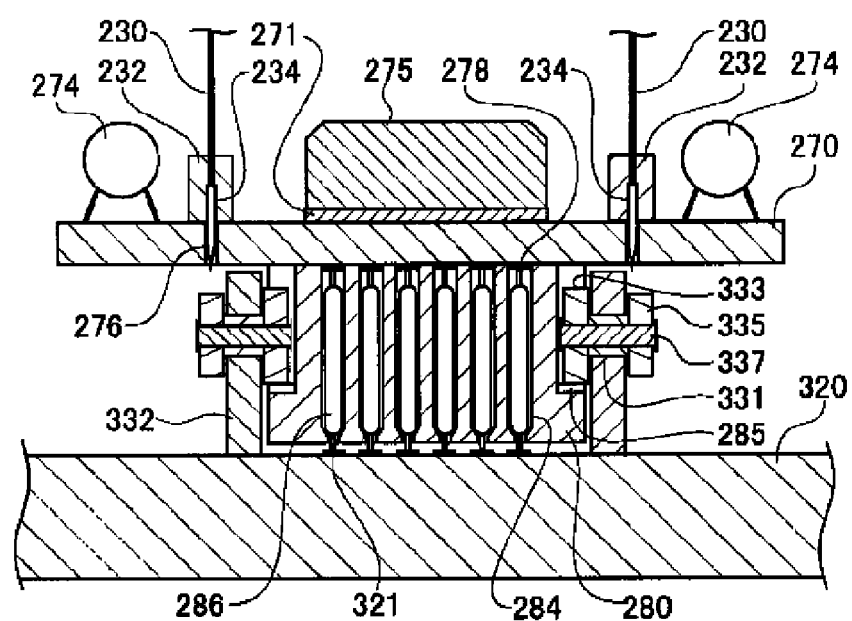
FIG. 13 is an enlarged cross sectional view of the contactor 202.

FIG. 13 is an enlarged cross sectional view of the contactor 202. The elements common to those in the other drawings are assigned the same reference numerals, and the overlapping explanation is omitted in the following.

The contactor housing 280 includes therein spring pins 286 in the housing holes 284 respectively. Both ends of a spring pin 286 are biased in the elongating direction thereof. Therefore, right after the contactor housing 280 is mounted on the sub-substrate 270, the upper end of the spring pin 286 is pressed against the contact pad 278 on the lower surface of the sub-substrate 270, to be electrically connected to the interconnection of the sub-substrate 270.

When a test is executed by the test apparatus 100, the contactor housing 280 enters the guide unit 330. The interval of the rollers 333 of the guide unit 330 is substantially the same as the width of the contactor housing 280, at the portion higher than the level difference. Therefore, by moving the operational bar 335 at the timing at which the roller 333 having passed the passing section 281 has reached the upper side of the level difference, the roller 333 can move along the level difference.

After passing the passing section 281 and through the tilting portion 283, the roller 333 will eventually run on the horizontal portion 285. In this process, the contactor housing 280 is pressed down towards the interconnection substrate 320. Accordingly, the lower edge of each of the spring pins 286 is pressed against the contact pad 321 on the upper surface of the interconnection substrate 320. In this way, a signal path will be formed starting from the probe card 300 including the interconnection substrate 320 through the contactor 202 and the flat cable 230 up to the test head.

Note that the above-described structure is merely an example of the structure of the contactor 202. Depending on the function required of the contactor 202, it is possible to increase the strength of the contactor housing 280 and to omit the reinforcing member 275 as well as the insulating sheet 271. It is also possible to omit the whole sub-substrate 270 by providing a receptacle 276 on the upper surface of the contactor housing 280.

Note that the contactor housing 280 is pressed against the interconnection substrate 320 by being attracted by each guide unit 330. Therefore even without large pressure on the entire contactor 202, electric coupling can be assuredly obtained. In addition, because the contactor housing 280 is attracted to the guide units 330 individually, the entire probe card 300 electrical coupling is achieved without imposing large pressure on the entire probe card 300.

The above-described example has such a structure that the roller 333 provided in the guide unit 330 is engaged with the level difference provided on the side surface of the contactor housing 280, to attract the contactor 202. However, such a function can be realized by various different forms. An example of such alternative structures is that a pin or a roller is provided for the contactor housing 280, and a level difference is provided for the guide unit 330. Moreover, instead of providing a roller 333 that moves with respect to the guide unit 330, the guide unit 330 itself can move.

Figure 14:
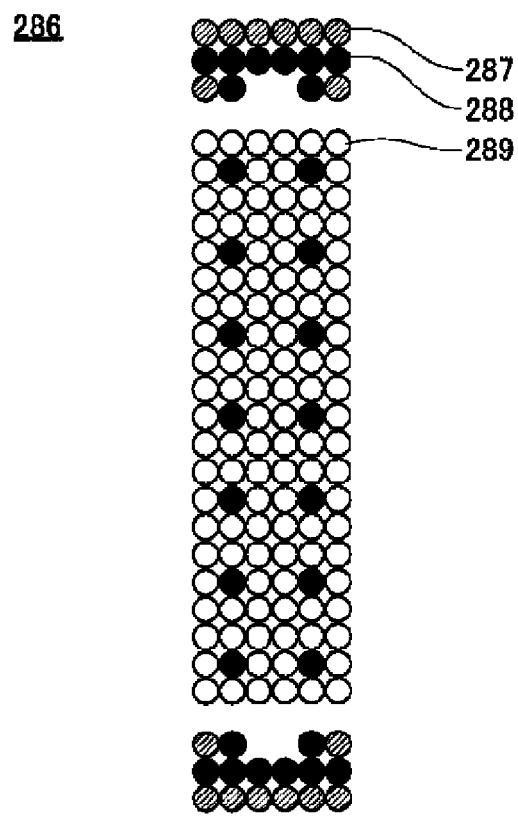
FIG. 14 is a diagram showing a signal arrangement in a contactor housing 280.

FIG. 14 is a diagram showing a signal arrangement of the spring pins 286 in a contactor housing 280. In a single contactor housing 280, three groups of housing holes 284 are provided. By setting, to be constant, the signal arrangement of the spring pins 286 inserted in each of these groups of housing holes, electrical connection can be established to the pad groups 324 by using the contactor 202 having the same specification. In addition, it is also possible to establish electrical connection to the plurality of pad groups 324, by moving a single contactor 202.

In the illustrated example, the power source line 287 is assigned to the spring pin 286 positioned at the end of the contactor housing 280, the signal line 289 is assigned to the spring pin 286 in about the middle of the contactor housing 280, and the ground line 288 is provided therebetween. In such a arrangement the power source line 287 can be shared, to be able to reduce the number of spring pins 286. In addition, the noise is prevented from entering the signal line 289 from the power source line 287.

Figure 15:
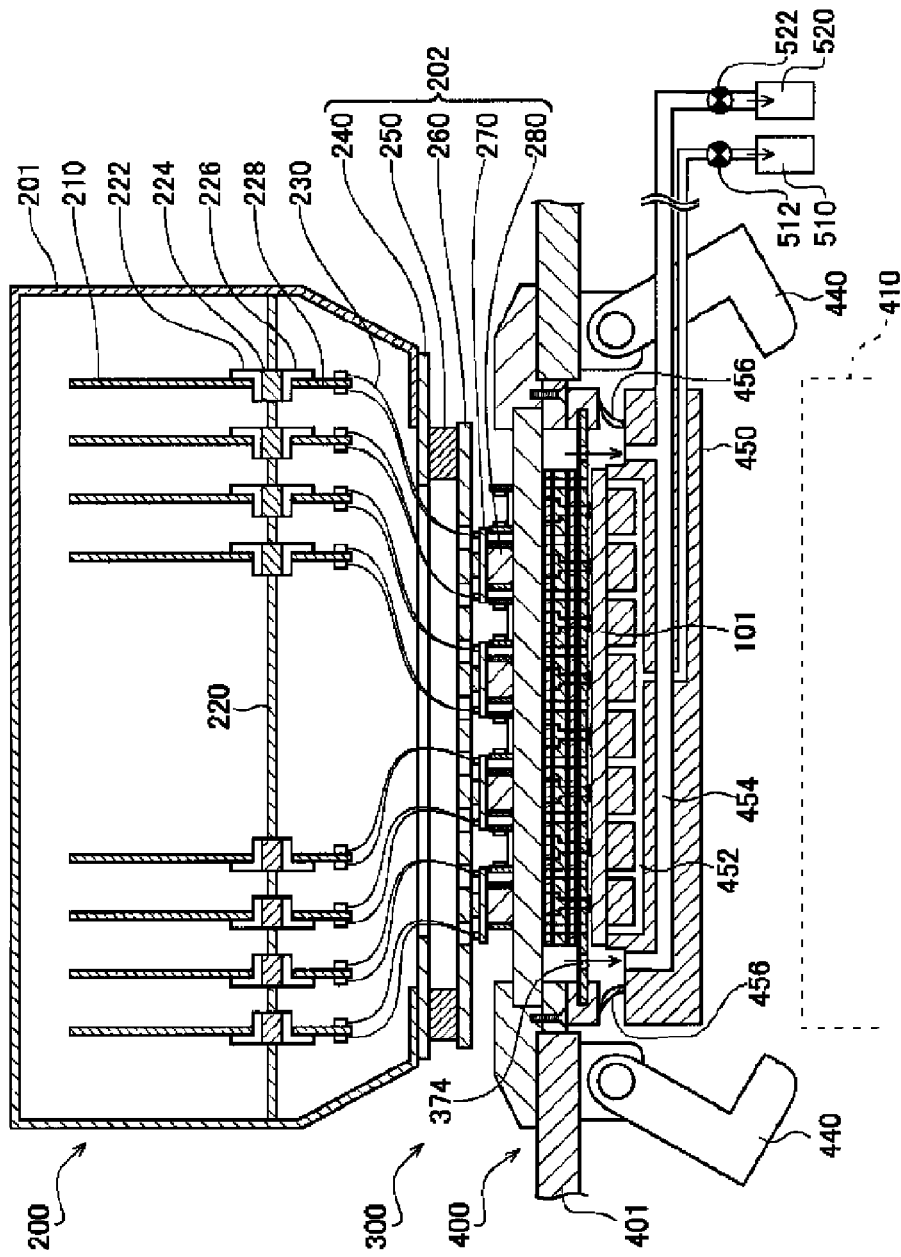
FIG. 15 is a cross sectional view of the test head 200 and the probe card 300.

FIG. 15 is a cross sectional view of the test head 200 and the probe card 300. The elements common to those in the other drawings are assigned the same reference numerals, and the overlapping explanation is omitted in the following.

The wafer tray 450 includes flow paths 452, 454, and a diaphragm 456. An end of the flow path 452 in an area to mount the wafer 101 on the upper surface of the wafer tray 450 is open. The other end of the flow path 452 is coupled to the depressurizing source 510 via a valve 512. Accordingly, by communicating the valve 512 while the wafer 101 is mounted, the wafer tray 450 adsorbs the wafer 101 to hold it.

The position of the opening of the flow path 454 of the wafer tray 450 on the upper surface of the wafer tray 450 is outside the region in which the wafer 101 is mounted. The other end of the flow path 454 is coupled to the depressurizing source 520 via the valve 522.

The diaphragm 456 is made of a material having elasticity, and is attached airtight to the periphery portion of the wafer tray 450 further outside the opening of the flow path 454. When the alignment stage 410 is raised to press the wafer 101 down to the lower surface of the probe card 300, the upper end of the diaphragm 456 will also contact the lower surface of the probe card 300, to seal between the wafer tray 450 and the probe card 300 airtight. By doing so, by bringing the valve 522 in communication while mounting the wafer 101, the wafer tray 450 adsorbs onto the lower surface of the probe card 300, to press the held wafer 101 onto the probe card 300.

Through holes 374 are provided through the elastic sheet 372 of the membrane unit 370 positioned on the lowest surface of the probe card 300. Accordingly, when the space between the probe card 300 and the wafer tray 450 is depressurized, the inside of the probe card 300 can be depressurized. As a result, the interconnection substrate 320, the PCR sheet 340, 360, the interposer 350, and the membrane unit 370 of the probe card 300 are pressured to each other, and therefore a signal path from the wafer 101 to the test head 200 can be assuredly formed.

In this way, the test apparatus 100 testing a plurality of devices formed on the wafer 101 is formed, which includes a probe card 300 to be connected to the plurality of device pads respectively at the lower surface of the probe card 300 to be overlapped on the wafer 101 and provided with the plurality of contact pads 321 on the upper surface of the probe card 300, and a contactor 202 connected sequentially to part of the plurality of contact pads 321 of the probe card.

Figure 16:
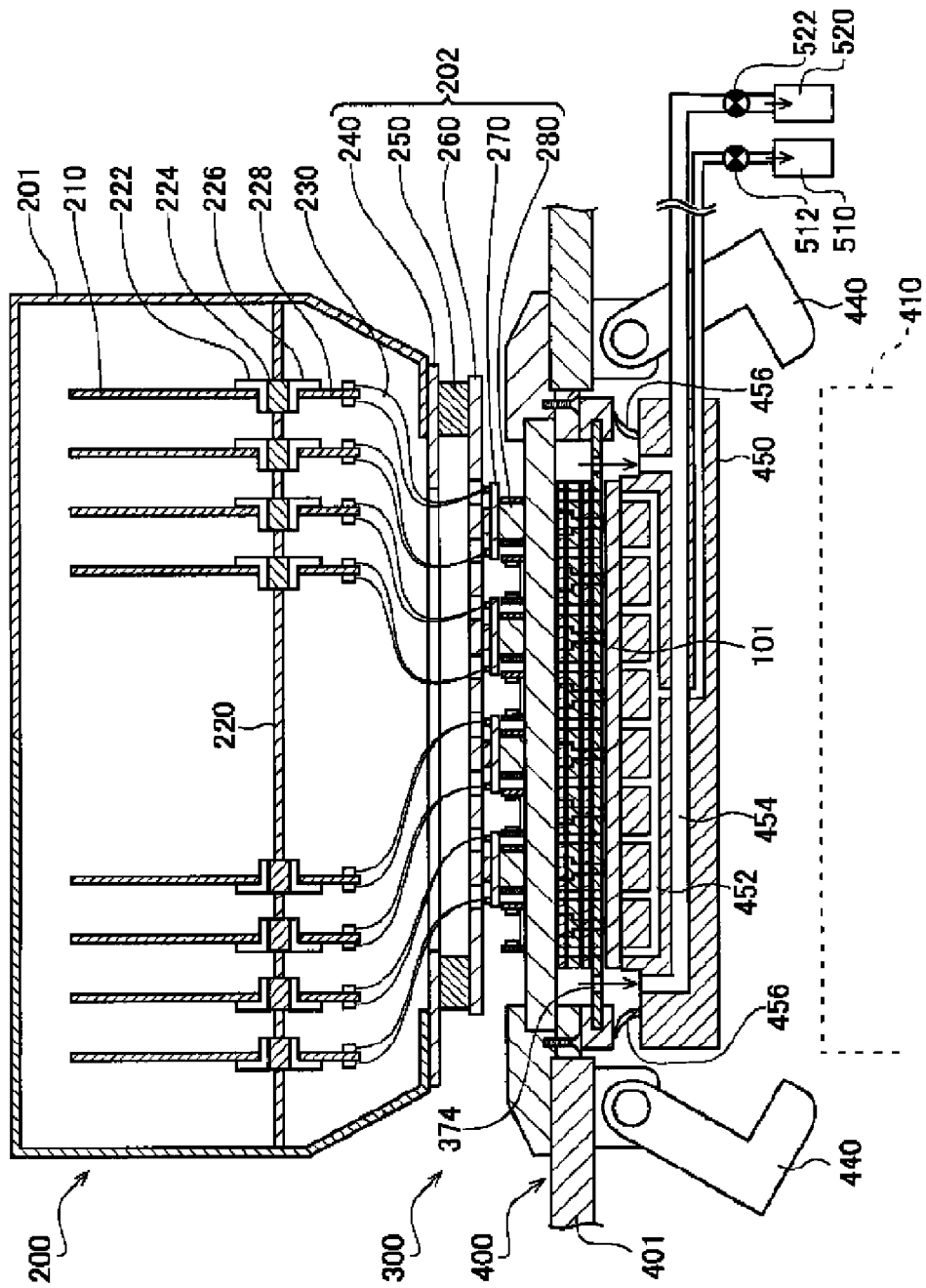
FIG. 16 is a cross sectional view of the test head 200 and the probe card 300.

FIG. 16 is a cross sectional view of the test head 200 and the probe card 300. This drawing is not different from FIG. 15 except that the contactor substrate 260 and the contactor housing 280 of the contactor 202 are moved, to fit to the guide units 330 different from that of FIG. 15. Therefore, the common elements are assigned the same reference numerals, and the overlapping explanation is omitted.

The operational bar 335 of the guide unit 330 is moved to move the roller 333 to the position of the passing section 281, the contactor housing 280 can be raised from the guide unit 330. In this state, by operating the three-dimensional actuator 250 in the contactor 202, the contactor substrate 260, the sub-substrate 270, and the contactor housing 280 can be raised, to pull out the contactor housing 280 from the guide unit 330.

Furthermore, by operating the three-dimensional actuator 250, the contactor substrate 260, the sub-substrate 270, and the contactor housing 280 are moved in the horizontal direction (to the right in the illustrated example), and lowered again at a different position, thereby allowing the contactor housing 280 to be inserted into the guide unit 330 having been empty in the state shown in FIG. 15. The attracting mechanism by the roller 333 and the signal arrangement for the contact pad 321 are common also inside the other guide unit 330, and therefore the same test head 200 can be used to execute the same test also in the other guide units 330.

Figure 17:
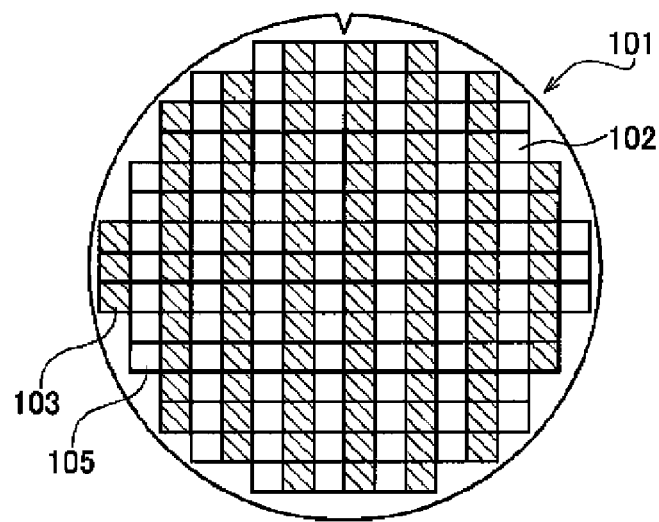
FIG. 17 is a plan view showing a test execution region 103.

FIG. 17 is a plan view showing a region to be subjected to a test in the wafer 101. When the contactor 202 and the probe card 300 are connected as shown in FIG. 15, every other columns of element regions 102 from the left-most column in the plurality of element regions 102 of the wafer 101 become a test execution region 103 to be subjected to a test, as shown with the oblique lines in the drawing, for example.

In addition, the other element regions 102 correspond to the guide units 330 not connected to contactor 202, and so constitute a non-test execution region 105 not to be subjected to a test.

Figure 18:
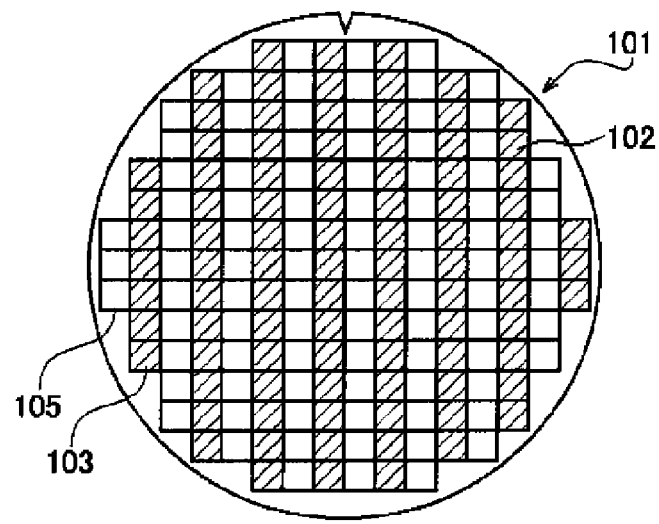
FIG. 18 is a plan view showing the test execution region 103.

FIG. 18 is a plan view also showing a region to be subjected to a test in the wafer 101. FIG. 18 shows a case where the contactor 202 and the probe card 300 are connected as shown by FIG. 16, as a result of the displacement of the contactor 202.

In this example, the element regions 102 used to constitute the test execution region 103 in FIG. 17 constitute a non-test execution region 105. In addition, the non-test execution region 105 in FIG. 17 is now a test execution region 103.

In this way, each of the pad group 324 on the probe card 300 may be sequentially connected to the adjacent element regions 102 on the wafer 101. In this way, by moving the contactor 202, a test to the entire wafer 101 can be halved. In other words, by performing one test to the entire wafer 101 by dividing it into two, the size of the test head 200 can be halved than performing the test at once.

In addition, the contactor 202 has a configuration to abut against and distanced from the upper surface of the probe card 300 whose pitch and area of the contact pad 321 is enlarged, and therefore can allow certain tolerance for the positioning accuracy of the contactor 202, compared to the structure to directly abut the contactor 202 to the wafer 101. Accordingly, the rise/fall or movement of the contactor 202 can be conducted in high speed, to improve the throughput of the test apparatus 100.

Note that a test to the entire wafer 101 can also be divided into three or more, not limited to two as explained above. In fact, a test of the entire wafer 101 can be divided into "n," by sequentially connecting the contactor 202 including the plurality of spring pins 286 corresponding to each "n" element regions 102 in the alignment on the wafer 101. By testing a single wafer 101 by dividing the test into "n" portions, the force to press the probe card 300 to the contactor 202 becomes 1/n, due to which the test apparatus 100 can advantageously has more than sufficient strength and capacity of motivity. There will be also tolerance allowed for the strength for the probe card 300 or the like, to be able to test the wafer 101 without large burden which would cause warpage on the wafer 101.

Furthermore, even if such a small pressing force is used to press the contactor 202, the electrical connection between the contactor 202 and the prove card 300 can be assuredly obtained. Note that depending on the number of devices formed on the wafer 101, the number of guide units 330 including the effective pad groups 324 on the interconnection wafer 320, there will be cases where the number of connection is not "n" even when the connection destination of the contactor 202 is "n".

In addition, the arrangement of the test execution region 103 and the non-test execution region 105 is not limited to as shown in the drawings. For example, the test execution regions 103 may be arranged in a checkered pattern, to distribute evenly throughout the wafer 101 the heat generated by the element regions 102 in the test.

In this way, a test can be divided into several portions, by having a plurality of contactors 202 corresponding to a part of the multitude of element regions 102 arranged on the wafer 101, and by sequentially connecting them to the wafer 101 via the probe card 300. Accordingly, the number of electric contacts and pin electronics having great impact on cost is reduced, thereby reducing cost of the test apparatus 100.

The reduction in number of the constituting elements explained above can also help reduce the size of the test apparatus 100. For example, there are four test heads 200 provided in the above example, if the number of pin electronics 210 which each of the test heads 200 mounts is reduced to half, the size of each test head 200 can also be substantially halved.

Furthermore, the four test heads 200 share a single EFEM 110 in common, the number of robot arms 116 to be used can be reduced, as well as enabling to position the plurality of test heads 200 in close proximity with each other. As a result, the size of the entire test apparatus 100 can be greatly reduced. The reduction in size and cost of the test apparatus 100 can be further advanced by reducing the size of the load units 130.

Note that the above-described embodiment has a structure of connecting the contactor 202 to different pad groups 324 by moving the contactor 202 with respect to the fixed probe card 300. However, the structure of the test apparatus 100 is not limited to this. In fact, the test apparatus 100 can also adopt such a structure to collectively move the probe card 300, the wafer 101, and the wafer tray 450, while keeping the contactor 202 fixed.

In addition, the connection between the wafer 101 and the probe card 300, or the connection between the probe card 300 and the contactor 202 are realized by contact of the bumps 373, the contact pads 321, or the like. However, in the test apparatus 100, the connection may also be established by means of the signal transfer by means of the capacity coupling between the conductors in close proximity, optical signal transfer between the facing end surfaces, or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A test apparatus for testing a plurality of devices under test formed on a semiconductor wafer, comprising:
    a probe card that includes, on a connection surface to be overlapped on the semiconductor wafer, a plurality of bumps to be connected to respective device pads of the plurality of devices under test, the probe card further including, on a rear surface of the connection surface, a plurality of contact pads respectively corresponding to the plurality of bumps;
    a test head that includes pin electronics, to which an electric circuit required for each test is mounted, and a contactor that includes a contactor housing for holding a spring pin connected to the pin electronics and a three-dimensional actuator for supporting the contactor housing, the test head causing the spring pin to be sequentially connected to each part of the plurality of contact pads by moving the contactor housing with a horizontal movement and a vertical extension and contraction of the three-dimensional actuator;
    a tilting portion that is provided on one of the probe card and the contactor and inclines with respect to a surface of the probe card;
    a roller that is provided on the other of the probe card and the contactor and contacts the tilting portion; and
    an operation bar that presses the probe card and the contactor to each other by causing the tilting portion and the roller to move relatively to each other in a direction parallel to the probe card, wherein
    the test head tests the plurality of devices under test on the semiconductor wafer using the pin electronics connected to the contactor that is pressed to each part of the plurality of contact pads.

2. The test apparatus according to claim 1, wherein the plurality of contact pads includes "n" sets of pad groups having the same signal arrangement.

3. The test apparatus according to claim 1, wherein the plurality of contact pads are divided into a plurality of pad groups each including two or more contact pads, and each of the plurality of pad groups is sequentially connected to each adjacent device under test on the semiconductor wafer.

4. A test apparatus for testing a plurality of devices under test formed on a semiconductor wafer, comprising:
    a probe card that includes, on a connection surface to be overlapped on the semiconductor wafer, a plurality of bumps to be connected to respective device pads of the plurality of devices under test, the probe card further including, on a rear surface of the connection surface, a plurality of contact pads respectively corresponding to the plurality of bumps;
    a plurality of test heads that each include pin electronics, to which an electric circuit required for each test is mounted, and a contactor that includes a contactor housing for holding a spring pin connected to the pin electronics and a three-dimensional actuator for supporting the contactor housing, each test head causing the spring pin to be sequentially connected to each part of the plurality of contact pads by moving the contactor housing with a horizontal movement and a vertical extension and contraction of the three-dimensional actuator;
    a tilting portion that is provided on one of the probe card and the contactor and inclines with respect to a surface of the probe card;
    a roller that is provided on the other of the probe card and the contactor and contacts the tilting portion; and
    an operation bar that presses the probe card and the contactor to each other by causing the tilting portion and the roller to move relatively to each other in a direction parallel to the probe card, wherein
    each of the plurality of test heads tests the plurality of devices under test on the semiconductor wafer using the pin electronics connected to the contactor that is pressed to each part of the plurality of contact pads.

5. A test apparatus for testing a plurality of devices under test formed on a plurality of semiconductor wafers, comprising:
    a plurality of probe cards that each include, on a connection surface to be overlapped on each semiconductor wafer, a plurality of bumps to be connected to respective device pads of the plurality of devices under test, and further include, on a rear surface of the connection surface, a plurality of contact pads respectively corresponding to the plurality of bumps;
    a plurality of test heads that each include pin electronics, to which an electric circuit required for each test is mounted, and a contactor that includes a contactor housing for holding a spring pin connected to the pin electronics and a three-dimensional actuator for supporting the contactor housing, each test head causing the spring pin to be sequentially connected to each part of the plurality of contact pads by moving the contactor housing with a horizontal movement and a vertical extension and contraction of the three-dimensional actuator;
    a tilting portion that is provided on one of i) the plurality of probe cards and ii) the contactor and inclines with respect to a surface of the plurality of probe cards;
    a roller that is provided on the other of i) the plurality of probe cards and ii) the contactor and contacts the tilting portion; and an operation bar that presses the plurality of probe cards and the contactor to each other by causing the tilting portion and the roller to move relatively to each other in a direction parallel to the plurality of probe cards, wherein each of the plurality of test heads tests the plurality of devices under test on the plurality of semiconductor wafers using the pin electronics connected to the contactor that is pressed to each part of the plurality of contact pads.

* * * * *